(12) United States Patent
Stengelin

(10) Patent No.: US 8,010,704 B2
(45) Date of Patent: Aug. 30, 2011

(54) METHOD OF EFFICIENT COMPRESSION FOR MEASUREMENT DATA

(75) Inventor: Hartmut Stengelin, Mainz (DE)

(73) Assignee: GM Global Technology Operations LLC, Detroit, MI (US)

( * ) Notice: Subject to any disclaimer, the term of this patent is extended or adjusted under 35 U.S.C. 154(b) by 616 days.

(21) Appl. No.: 12/128,957

(22) Filed: May 29, 2008

(65) Prior Publication Data

US 2009/0300039 A1 Dec. 3, 2009

(51) Int. Cl.
*G06F 13/00* (2006.01)
(52) U.S. Cl. .......... 709/247; 709/250; 709/230
(58) Field of Classification Search .......... 709/246, 709/247, 250
See application file for complete search history.

(56) References Cited

U.S. PATENT DOCUMENTS

| | | | | |
|---|---|---|---|---|
| 4,151,421 A * | 4/1979 | Sumi | ......... | 250/492.2 |
| 6,466,902 B1 * | 10/2002 | Lu | ......... | 704/9 |
| 7,224,293 B2 * | 5/2007 | Parker | ......... | 341/51 |
| 2007/0247350 A1 | 10/2007 | Ryan | | |
| 2009/0129684 A1 * | 5/2009 | Lee et al. | ......... | 382/232 |

* cited by examiner

*Primary Examiner* — Viet Vu
(74) *Attorney, Agent, or Firm* — John A. Miller; Miller IP Group, PLC

(57) ABSTRACT

A method for compressing measurement data that includes grouping common data elements in common data messages. Sequential data elements in the groups are subtracted from each other to provide difference values. The difference values are compressed using a suitable compression algorithm to provide compressed blocks of data. Time stamp periods associated with each common data message are also subtracted from each other to provide time stamp difference values. The time stamp difference values are also compressed to provide compressed time stamp blocks. The compressed blocks of data and time stamp blocks are then stored.

19 Claims, 4 Drawing Sheets

FIG - 1

| Time | MsgID | Length | Data | | | | | | |
|------|-------|--------|----|----|----|----|----|----|----|
| 100 | 3FC | 8 | 00 | 34 | 81 | 32 | AB | 66 | 90 | F0 |
| 120 | 201 | 4 | 41 | 08 | 7A | 34 | | | |
| 140 | 1AC | 7 | 05 | 01 | 62 | 91 | 00 | 44 | 00 |
| 180 | 5F0 | 3 | 00 | 00 | 01 | | | | |
| 200 | 3FC | 8 | 00 | 33 | 81 | 31 | AB | 67 | 90 | F0 |
| 220 | 1AC | 7 | 05 | 02 | 63 | 91 | 00 | 44 | 00 |
| 270 | 5FO | 3 | 00 | 01 | 01 | | | | |
| 300 | 3FC | 8 | 00 | 34 | 81 | 30 | AA | 66 | 90 | F0 |
| 310 | 201 | 4 | 42 | 08 | 79 | 34 | | | |
| 360 | 5F0 | 3 | 00 | 35 | 01 | | | | |
| 380 | 1AC | 7 | 05 | 01 | 63 | 91 | FF | 44 | 00 |
| 400 | 3FC | 8 | 00 | 33 | 81 | 2F | AB | 67 | 90 | F0 |

FIG - 3

| Time | MsgID | | Period | Difference |
|------|-------|--|--------|------------|
| 100 | 3FC | | | |
| 120 | 201 | | | |
| 140 | 1AC | | 100 | 100 |
| 180 | 5F0 | | | |
| 200 | 3FC | | | |
| 220 | 1AC | | | |
| 270 | 5FO | | 100 | 0 |
| 300 | 3FC | | | |
| 310 | 201 | | | |
| 360 | 5F0 | | 100 | 0 |
| 380 | 1AC | | | |
| 400 | 3FC | | | |
| 470 | 1AC | | 102 | 2 |
| 502 | 3FC | | | | ial
METHOD OF EFFICIENT COMPRESSION FOR MEASUREMENT DATA

BACKGROUND OF THE INVENTION

1. Field of the Invention

This invention relates generally to a method for compressing data and, more particularly, to a method for compressing measurement data that includes grouping common elements in the data, subtracting successive data elements in the groups of common data elements and compressing the subtracted values.

2. Discussion of the Related Art

Modern vehicles include many systems, sub-systems, actuators, sensors, etc. that provide measurement data that is transferred between various systems and sub-systems on the vehicle that allow the vehicle to operate in a desired manner. Typically, the data is transferred between the systems and sub-systems on one or more data busses, sometimes referred to as a controller area network (CAN) data bus. One known vehicle system uses five CAN data busses. When a vehicle is being serviced, tested, developed, etc., the measurement data on the CAN bus is typically transferred to testing equipment and the like separate from the vehicle. It is necessary that this data be stored in a storage device, from which it is then subsequently analyzed. However, a problem exists because the amount of data produced by the vehicle over a certain period of time can be very large, requiring a very large storage device, which increases cost.

Various compression algorithms are known in the art that compress various types of data so that the data can be stored in a memory without using as much storage space as would normally be required. These compression algorithms include WinZip, MP3, etc., all well known to those skilled in the art. A typical compression rate for known lossless compression algorithms is between two and four, meaning that the average reduction of the storage space required for the digital data is reduced by a factor of two to four from the original data.

Further, not only is the amount of storage space required in various applications significant, but the transfer time for transmitting the data from the storage device to the testing equipment is also significant. Thus, it typically takes a large amount of time to download the data from the storage device, also increasing cost.

The well known MP3 compression algorithm has a relatively high compression rate, typically between 10 and 12 depending on the bit rate used. However, because it is used for audio compression, the algorithm provides for a certain amount of loss as a result of the compression process where the restored audio or music will not be of the same quality as the original audio or music. For audio compression, such a lossy compression process is typically sufficient because the difference in music quality is not discernable to human ears. However, for measurement data compression, such losses would not be acceptable.

SUMMARY OF THE INVENTION

In accordance with the teachings of the present invention, a method for compressing measurement data is disclosed that includes grouping common data elements in common data messages. Sequential data elements in the groups are subtracted from each other to provide difference values. The difference values are compressed using a suitable compression algorithm to provide compressed blocks of data. Time stamp periods associated with each common data message are also subtracted from each other to provide time stamp difference values. The time stamp difference values are also compressed to provide compressed time stamp blocks. The compressed blocks of data and time stamp blocks are then stored.

Additional features of the present invention will become apparent from the following description and appended claims, taken in conjunction with the accompanying drawings.

BRIEF DESCRIPTION OF THE DRAWINGS

FIG. 1 is an illustration of a sequence of data measurement messages to be compressed;

FIG. 3 is a list of the time stamp and message IDs from the messages in FIG. 1 showing a difference in time of the time stamps for common messages;

DETAILED DESCRIPTION OF THE EMBODIMENTS

Figure 2:
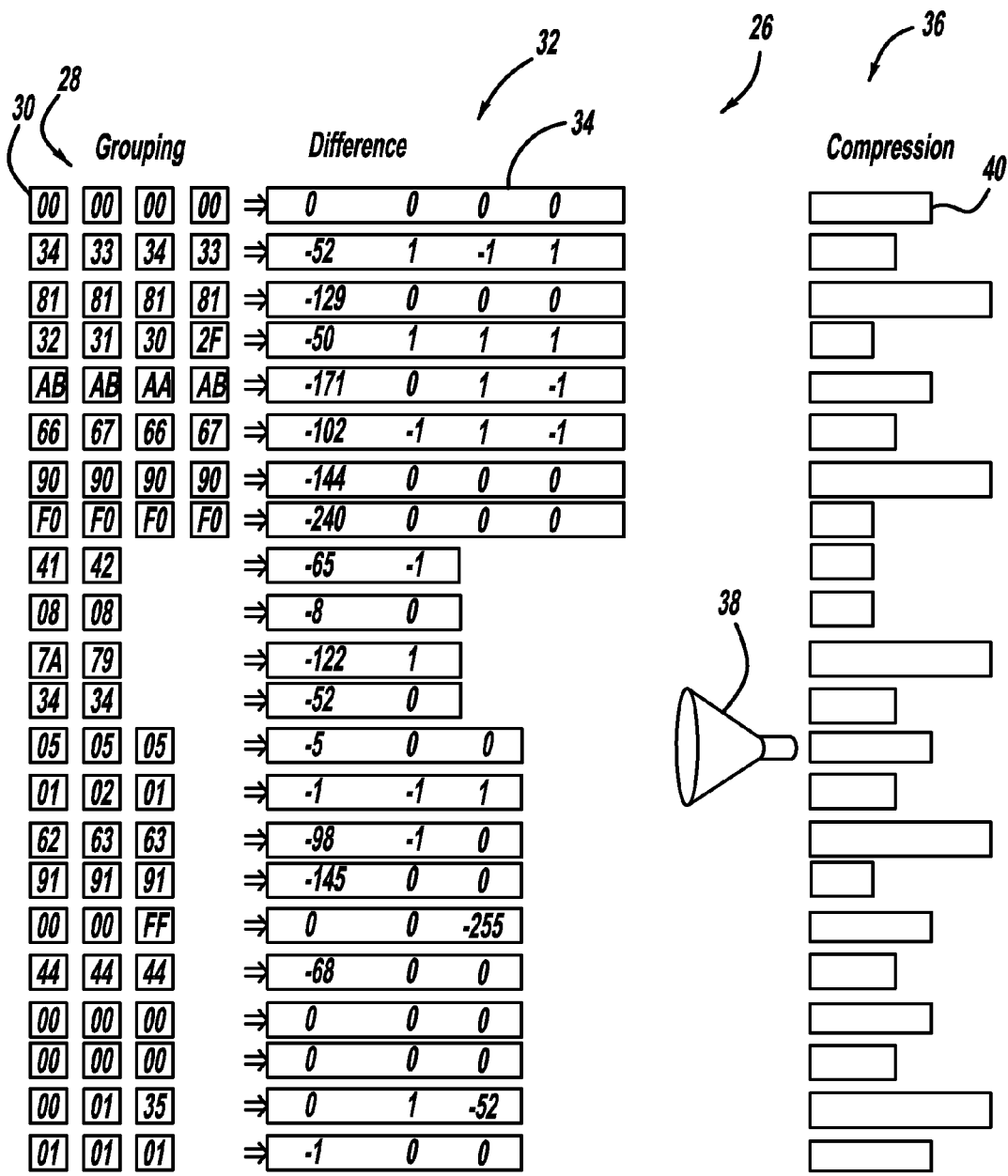
FIG. 2 is an illustration of a compression process that includes grouping, differencing and compressing data elements in the messages shown in FIG. 1.

The following discussion of the embodiments of the invention directed to a compression process for compressing data is merely exemplary in nature, and is in no way intended to limit the invention or its applications or uses. For example, the compression process discussed below has particular application for compressing measurement data from a vehicle CAN data bus. However, as will be appreciated by those skilled in the art, the compression process of the invention will have application for compressing other types of data in other types of environments.

FIG. 1 is an illustration of a list of twelve CAN measurement data messages 10 that are provided sequentially on one or more CAN data busses in a vehicle. The messages 10 are in hexadecimal format, where the numbers 10-15 are represented by the letters A, B, C, D, E and F. The messages 10 include a time stamp 12 in milliseconds that identifies the time when the messages 10 are transmitted on the CAN bus. The messages 10 also include a message ID 14 and a message length 16.

The messages 10 further includes a data portion 18 separated into a plurality of data bytes 20, each of them represented by two hexadecimal values. The formatting of the messages and the information contained therein is merely for example purposes.

FIG. 2 is an illustration of a compression process 26 that compresses the CAN data messages 10 shown in FIG. 1 as an example of the compression process of the invention. As will be discussed below, the compression process 26 compresses the data based on common data elements in common messages. In other words, the same data bytes 20 in each message 10 having the same message ID 14 are grouped together. Measurement data contains several variables that are stored in one file. The process 26 groups all of the bytes 20 belonging to one variable, where each variable will be processed separately. If the variable is composed of several bytes, each byte is stored in a separate group and processed separately.

The process 26 includes a grouping section 28 having boxes 30 that are filled with a particular data byte 20 from a particular data message 10. For example, the group in the first row in the grouping section 28 includes the first bytes 20 in the data portion 18 of the messages 10 having the message ID 3FC. The next row is the next data byte 20 in the data portion 18 for the same message ID. This process continues until all of the common bytes 20 from a particular message having a common message ID are grouped together. This grouping process continues to the next message 10 having the same message ID, particularly 201. The first data bytes 20 for the messages identified with the message ID 201 are grouped together after all of the data bytes 20 for the message ID 3FC have been grouped together. Because there are five messages having different message IDs in the sequence of messages 10 shown in FIG. 1, there will be twenty-two groups because there are twenty-two data bytes 20 in the five messages that have different message IDs.

The next step in the process 26 is to provide sequential difference values between the data bytes 20 in each group, as shown by difference section 32. The difference values represent a change of the measurement data from one time to the next time. Normally, measurement values change slowly, which causes changes in the bytes 20 from one time stamp 12 to the next time stamp 12 to be small. Particularly, the data for a vehicle will not change very quickly during the time frame from one message 10 with one message ID 14 to the next message 10 with the same message ID 14. It is possible to group the data and then provide the differencing in this manner for the compression because each byte 20 that is in the same location of the data portion 18 for those messages 10 having the same message ID 14 will have the same information, such as temperature, pressure, speed, etc. For the case of a variable that is represented by several bytes 20, the higher more significant bytes 20 change extremely seldom. Those bytes 20 contain only bytes with zero except for the first byte.

The difference section 32 of the method 26 shows rows 34 of difference values. For the first row 34, all of the bytes 20 in the group are zero, so that all of the difference values are zero. For the next row 34, the difference between the first byte and the preceding byte is −52 because there is not a preceding byte, which is presumed to be zero. The hexadecimal difference value is converted to a decimal value for clarity purposes. The difference values are provided for all of the bytes 20 in all of the messages 10.

The difference values for each group are then passed to a compression device 38 in a compression section 36 of the process 26, where the compression device 38 employs a suitable compression operation or algorithm. In one non-limiting embodiment, the compression algorithm used is the well known Burrows-Wheeler compression algorithm. Another example is the well known Huffman compression algorithm. Each row 34 of difference values is compressed into a much smaller block of data 40 by the compression algorithm. In one embodiment, the compression rate is sixteen, meaning that for every sixteen characters in the data, a single character will be stored. Different messages 10 have different periods, i.e., how often messages with the same message ID 14 are transmitted, depending on what information they include and how important it is, which will determine the size of the uncompressed blocks of data in the rows 34. The size of each compressed block of data 40 will also be determined by the type of data that is being compressed.

Data that is stored with different variable periods includes a time stamp for every value for each group with the same sample point. Because most data in a measurement system is periodic and the period changes are small, only the difference from the last period is stored in a compressed manner.

FIG. 3 shows the time stamp 12 and the message ID 14 for each of the messages 10 shown in FIG. 1. A period between the time stamps 12 for one message with one message ID 14 to the next message with the same message ID 14 is identified. Particularly, the value for the time stamp 12 of the transmission time of one message 10 is subtracted from the value of the time stamp for the next message with that message ID 14, and that value is identified as a period. In this example, the difference in the time stamp 12 between the first two messages with the message ID 3FC is 100 milliseconds. Next, a difference value is defined for the periods between subsequent time stamps for the messages 10 with the same message ID 14. In this example, the time difference 100 between the first two messages with message ID 3FC is 100 milliseconds, and this value is subtracted from zero because there is not a preceding message with the message ID 3FC in the messages 10 being compressed. The period between the second and third occurrence of the message ID 3FC is also 100 milliseconds. This value is subtracted from the first difference of 100 milliseconds to give a difference value of zero. This process is continued for all of the messages 10 with the same message ID, where the number of difference values is one less than the number of messages 10 having the same message ID 14.

Figure 4:
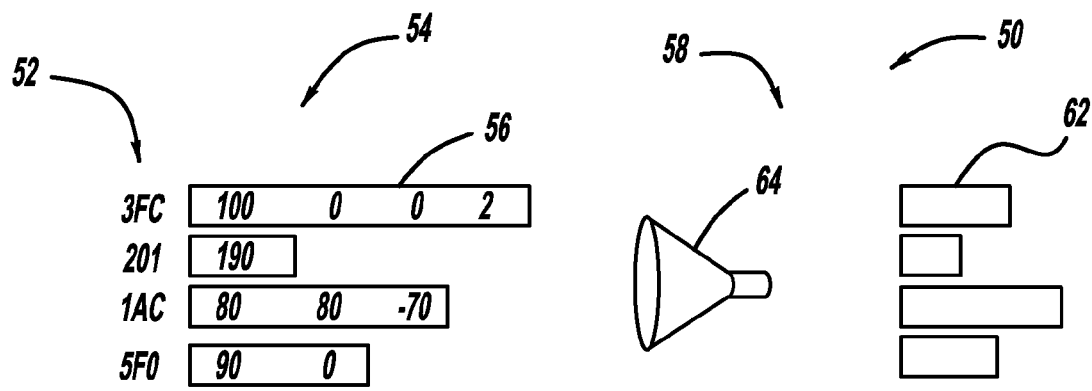
FIG. 4 is an illustration of a compression process that compresses the time stamp differences shown in FIG. 3.

FIG. 4 illustrates a compression method 50 for the time stamps 12 of the messages 10 shown in FIG. 1. A time stamp column 52 is identified for each separate time stamp 12 in the list of messages 10. The method 50 includes a differencing section 54 where the sequence of difference values for the particular message ID is provided in blocks 56. Difference values for all of the messages 10 with the same time stamp 12 are also provided. The blocks 56 are then separately processed by a suitable compression algorithm 64 in a compression section 58 of the method 50, in the same manner as discussed above. The size of the data in the blocks 56 is reduced by the compression algorithm 64 to produce time stamp compressed blocks 62.

Figure 5:
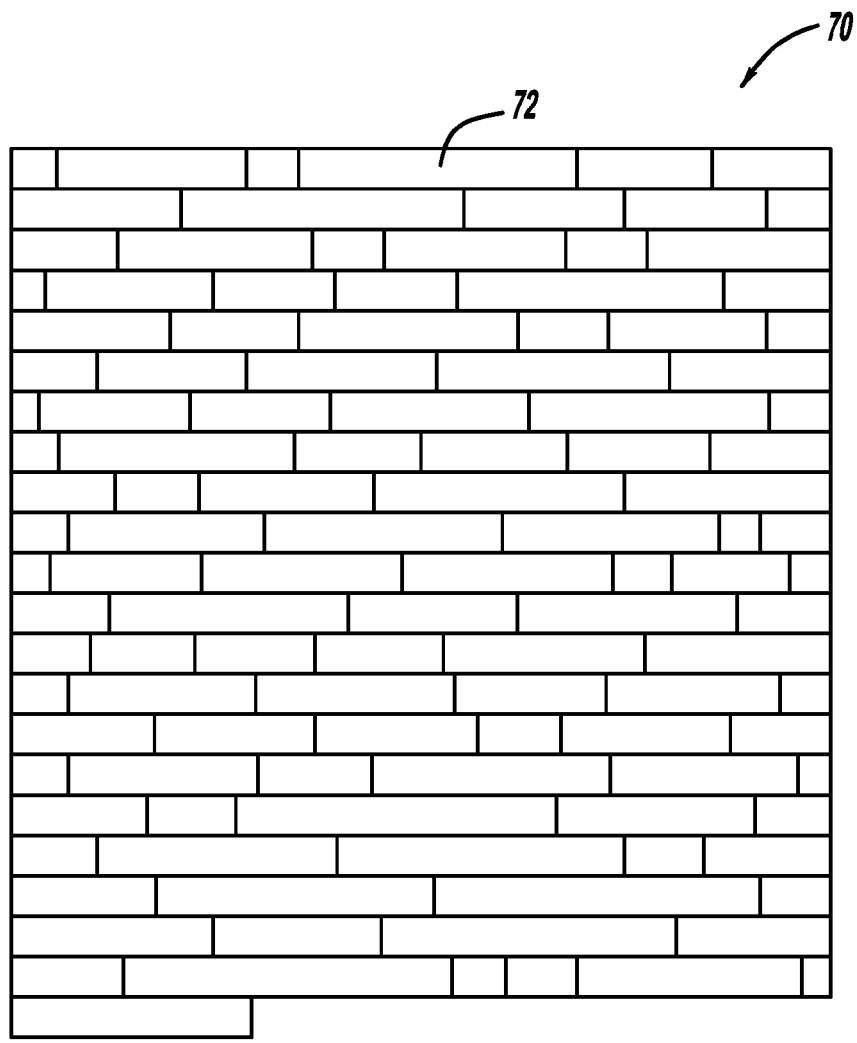
FIG. 5 is an illustration of compressed data bocks in a storage environment.

Once all of the compressed blocks 40 and 62 are provided they are stored in one file together with information describing the measurement data. FIG. 5 is a representation of a memory 70 that includes the stored compressed blocks 72.

Figure 6:
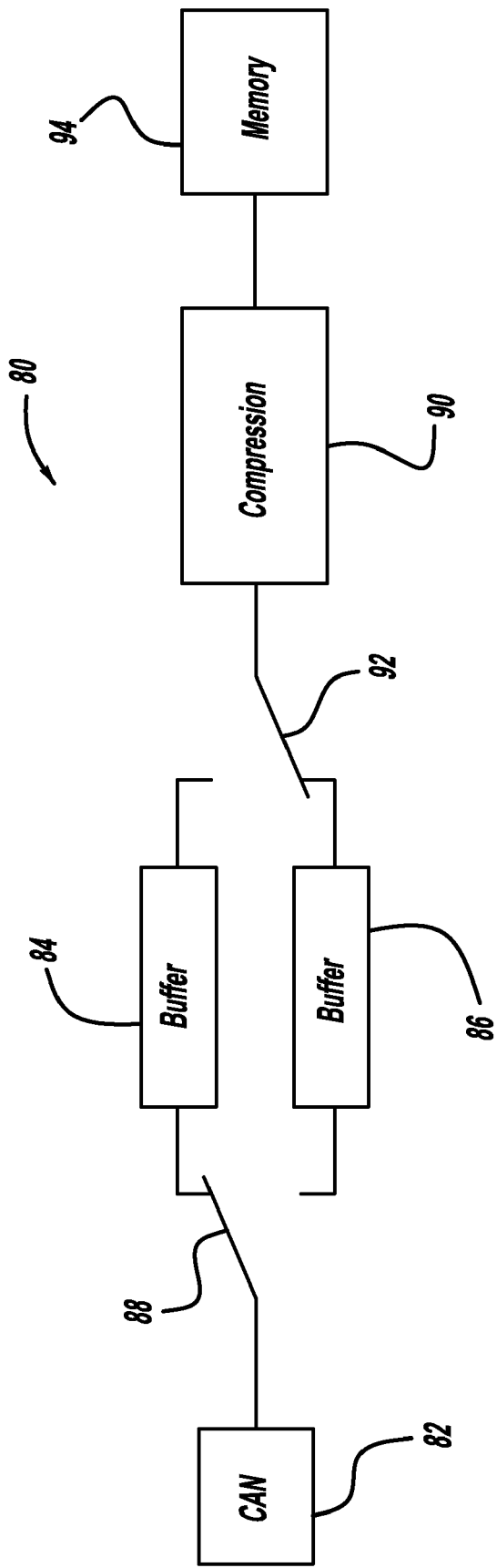
FIG. 6 is a block diagram of a compression system, according to an embodiment of the present invention.

FIG. 6 is a block diagram of a system 80 that shows one technique for buffering and compressing data. In this embodiment, data from a CAN data bus 82 is provided to either a first buffer 84 or a second buffer 86 through a switch 88. When the CAN bus 72 is connected to one of the buffers 84 or 86, then the other buffer 84 or 86, which has previously been filled with data from the CAN bus 72, is downloading its stored data to the compression process of the invention at block 90 through a switch 92. Thus, while one buffer 84 or 86 is being filled with data, the data in the other buffer 84 or 86 is being compressed. In one non-limiting embodiment, each buffer 84 and 86 can hold about one million messages. In this manner, the switches 88 and 92 are switched back and forth between the buffers 84 and 86 in a cyclical manner that allows one buffer 84 or 86 to be filled with data at the same time that the data in the other buffer 84 or 86 is being compressed. The compressed data from the block 90 is stored in a memory 94.

The decompression process of the compressed data is performed in a reverse manner of the compression process, and would be clear to those skilled in the art based on the compression process discussed above.

For compression of the vehicle measurement data discussed above, there is a big advantage for the decompression process. If a specific investigation of a vehicle system or sub-system is being made, or a particular problem is being analyzed, only the data associated with that system or sub-system needs to be looked at and analyzed. Because the data is grouped based on message ID and content, only the data for particular data groups needs to be looked at. Thus, the other data groups do not need to be decompressed, greatly speeding up the decompression process.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A method for compressing data, said method comprising:
   providing a time sequenced block of messages, each message including a time stamp, a message ID and data, where the data is provided in a plurality of bytes;
   identifying messages in the block of messages with the same message ID;
   grouping the bytes of data in the messages where bytes of data at the same location in the message for messages with the same message ID are grouped together;
   sequentially subtracting the bytes of data in each group to provide a series of subtracted values for each group; and
   compressing each series of subtracted values for each group into compressed data.

2. The method according to claim 1 wherein sequentially subtracting the bytes of data includes subtracting the first byte of data in the group from zero.

3. The method according to claim 1 further comprising subtracting the time stamps of sequential messages having the same message ID to provide time stamp series values, sequentially subtracting the time stamp series values to provide time stamp difference values and then compressing the time stamp difference values to provide compressed time stamp information.

4. The method according to claim 3 wherein the first time stamp series value is subtracted from zero to get the time stamp difference value.

5. The method according to claim 1 wherein compressing each series of subtracted values includes using a Burrows-Wheeler compression algorithm.

6. The method according to claim 1 wherein the data is measurement data.

7. The method according to claim 1 wherein providing a time sequenced block of messages includes providing a block of messages stored in at least one buffer.

8. The method according to claim 7 wherein providing a time sequence block of messages includes providing blocks of messages stored in two buffers where one buffer is being loaded with uncompressed messages while the messages in the other buffer is being compressed.

9. The method according to claim 1 wherein providing a time sequenced block of messages includes providing a block of data messages from a CAN data bus on a vehicle.

10. A method for compressing data, said method comprising:
    grouping common data elements in common data messages;
    sequentially subtracting the common data elements in each group to provide a series of subtracted values for each group; and
    compressing each series of subtracted values for each group into compressed data.

11. The method according to claim 10 wherein sequentially subtracting the common data elements includes subtracting a first data element in the group from zero.

12. The method according to claim 10 wherein the data is measurement data.

13. The method according to claim 10 further comprising storing the uncompressed data messages in at least one buffer.

14. The method according to claim 13 wherein the uncompressed messages are stored in two buffers where one buffer is being loaded with uncompressed data messages while data messages in the other buffer are being compressed.

15. The method according to claim 10 wherein the data messages are from a CAN data bus on a vehicle.

16. A method for compressing measurement data from a CAN data bus on a vehicle, said method comprising:
    providing a time sequence block of messages from the CAN data bus, each message including a time stamp, a message ID and a plurality of data bytes;
    identifying messages in the block of messages with the same message ID;
    grouping the bytes of data in the messages where bytes of data at the same location in the message for messages with the same message ID are grouped together;
    sequentially subtracting the bytes of data in each group to provide a series of subtracted values for each group, wherein sequentially subtracting the bytes of data includes subtracting the first byte of data in the group from zero;
    compressing each series of subtracted values for each group into compressed data;
    subtracting the time stamps of sequential messages having the same message ID to provide time stamp series values;
    sequentially subtracting the time stamp series values to provide time stamp difference values, where the first time stamp series value is subtracted from zero to get the time stamp difference value;
    compressing the time stamp difference values to provide compressed time stamp information; and
    storing the compressed data and the compressed time stamp information.

17. The method according to claim 16 wherein compressing the each series of subtracted values and the time stamp difference values includes using a Burrows-Wheeler compression algorithm.

18. The method according to claim 16 wherein providing a time sequenced block of messages includes providing a block of messages stored in at least one buffer.

19. The method according to claim 18 wherein providing a time sequence block of messages includes providing blocks of messages stored in two buffers where one buffer is being loaded with uncompressed data while the data in the other buffer is being compressed.

* * * * *